United States Patent
Kim et al.

(10) Patent No.: US 8,373,180 B2
(45) Date of Patent: Feb. 12, 2013

(54) LIGHT EMITTING DIODE PACKAGE

(75) Inventors: Hwa Ja Kim, Ansan-si (KR); Nam Young Kim, Ansan-si (KR); Myung Hee Lee, Ansan-si (KR); Kyoung Bo Han, Ansan-si (KR); Tae Kwang Kim, Ansan-si (KR); Ji Seop So, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 162 days.

(21) Appl. No.: 12/443,314

(22) PCT Filed: Sep. 21, 2007

(86) PCT No.: PCT/KR2007/004674
§ 371 (c)(1),
(2), (4) Date: Mar. 27, 2009

(87) PCT Pub. No.: WO2008/038978
PCT Pub. Date: Apr. 3, 2008

(65) Prior Publication Data
US 2010/0096653 A1    Apr. 22, 2010

(30) Foreign Application Priority Data

Sep. 29, 2006 (KR) .................. 10-2006-0095654

(51) Int. Cl.
*H01L 33/00* (2010.01)
(52) U.S. Cl. ........................................ 257/81; D13/180
(58) Field of Classification Search .................... 257/81; D13/180
See application file for complete search history.

(56) References Cited

U.S. PATENT DOCUMENTS

| | | | |
|---|---|---|---|
| 6,459,130 B1 * | 10/2002 | Arndt et al. | 257/432 |
| 6,835,960 B2 * | 12/2004 | Lin et al. | 257/81 |
| D526,970 S * | 8/2006 | Inoue | D13/180 |

(Continued)

FOREIGN PATENT DOCUMENTS

| | | |
|---|---|---|
| JP | 07-307492 | 11/1995 |
| JP | 08-242020 | 9/1996 |

(Continued)

OTHER PUBLICATIONS

Preliminary Notice of First Office Action dated Sep. 27, 2011 in Taiwanese Patent Application No. 096136264.

(Continued)

*Primary Examiner* — Wai Sing Louie
*Assistant Examiner* — Robert Carpenter
(74) *Attorney, Agent, or Firm* — H.C. Park & Associates, PLC

(57) ABSTRACT

A side-view type light emitting diode package for emitting light, emitted from a light emitting diode chip, toward a side surface is disclosed. The side-view type light emitting diode package comprises a package body having an opening portion for exposing the light emitting diode chip in a light emitting direction; and a light-transmittable resin covering the light emitting diode chip, wherein at least a portion of an inner wall of the opening portion is formed with a step projection for partitioning the opening portion into upper and lower sections, and the lower section of the opening portion below the step projection is filled with the light-transmittable resin. Accordingly, the light-transmittable resin with the convex lens shape may be easily formed, so that the light emission efficiency thereof can be improved.

11 Claims, 3 Drawing Sheets

(a)

(b)

U.S. PATENT DOCUMENTS

| | | | |
|---|---|---|---|
| 7,531,848 B2* | 5/2009 | Shin | 257/100 |
| 2004/0041222 A1* | 3/2004 | Loh | 257/433 |
| 2004/0173808 A1* | 9/2004 | Wu | 257/99 |
| 2004/0208210 A1* | 10/2004 | Inoguchi | 372/36 |
| 2005/0145991 A1* | 7/2005 | Sakamoto et al. | 257/604 |
| 2005/0205974 A1* | 9/2005 | Su et al. | 257/678 |
| 2005/0221519 A1* | 10/2005 | Leung et al. | 438/27 |
| 2006/0091403 A1* | 5/2006 | Chang et al. | 257/79 |

FOREIGN PATENT DOCUMENTS

| | | |
|---|---|---|
| JP | 2002033520 A * | 1/2002 |
| JP | 2005-175048 | 6/2005 |

OTHER PUBLICATIONS

Taiwanese Preliminary Notice of the First Office Action and Search Report dated Feb. 10, 2011 on TW Application No. 096136264, which corresponds to U.S. Appl. No. 12/443,314.

Taiwan Intellectual Property Office (TIPO) First Office Action dated Aug. 10, 2012 in Taiwan Patent Application No. 96136264.

* cited by examiner

Related Art

LIGHT EMITTING DIODE PACKAGE

CROSS REFERENCE TO RELATED APPLICATIONS

This application is the National Stage of International Application No. PCT/KR2007/004674, filed Sep. 21, 2007, and claims priority from and the benefit of Korean Patent Application No. 10-2006-0095654, filed on Sep. 29, 2006, which are both hereby incorporated by reference for all purposes as if fully set forth herein.

BACKGROUND OF THE INVENTION

1. Field of the Invention

The present invention relates to a light emitting diode package, and more particularly, to a side-view type light emitting diode package adopting an opening portion, wherein at least a portion of an inner wall of the opening portion is provided with a step projection.

2. Discussion of the Background

Generally, a light source system using a light emitting diode chip is formed by mounting a light emitting diode chip into various kinds of packages depending on their use. Since a side-view type light emitting diode package is located on a side surface of a light guide plate to provide light in parallel therewith, it is generally used as a backlight illuminator for a display.

FIGS. 1 and 2 are plan and perspective views illustrating a conventional side-view type light emitting diode package, respectively, and FIG. 3 is a sectional view taken along a dashed dotted line A-A of FIG. 1.

Referring to FIGS. 1 to 3, the side-view type light emitting diode package includes a pair of lead terminals, i.e., first and second lead terminals 11 and 13. The first and second lead terminals 11 and 13 are formed out of a lead frame manufactured with a phosphor bronze plate, and a surface thereof is plated with silver in order to increase light reflectivity. The first and second lead terminals 11 and 13 are supported by a package body 15. The package body 15 is generally formed by insert molding the lead terminals with polyphthalamide (PPA).

For convenience of description, the package body 15 may be sectionalized into an upper package body 15a and a lower package body 15b based on the position level of the first and second lead terminals 11 and 13.

The upper package body 15a has an opening portion 16 for exposing the first and second lead terminals 11 and 13. The first and second lead terminals 11 and 13 are positioned on a bottom surface of the opening portion 16, i.e., on the lower package body 15b, and spaced apart from each other in the opening portion 16. Further, the first and second lead terminals 11 and 13 protrude to the outside of the package body 15 in order to be electrically connected to an external power source. The first and second lead terminals 11 and 13 which protrude outward may have various shapes and be bent with various shapes. FIGS. 1 and 2 show the first and second lead terminals 11 and 13 which are bent from a lower surface of the package body 15 to side surfaces thereof to implement surface mounting.

A light emitting diode chip 17 is mounted onto the first lead terminal 11 in the opening portion 16 to be electrically connected to the first lead terminal 11, and electrically connected to the second lead terminal 12 using a bonding wire 19. The opening portion 16 may be filled with a light-transmittable resin 23, and a phosphor may be contained in the light-transmittable resin.

The conventional side-view type light emitting diode package is provided with the opening portion 16 with an elongated shape, and sidewalls, specifically sidewalls 15w in a major axis are formed to be inclined to widen a visible angle in the major axis. Accordingly, a side-view type light emitting diode package suitable to a backlight for display may be provided, and a side-view type light emitting diode which emits white light may be provided by the suitable selection of a light emitting diode chip and a phosphor.

However, in the conventional side-view type light emitting diode package, when the opening portion 16 for exposing the light emitting diode chip is filled with the light-transmittable resin 23 containing a phosphor, the light efficiency may be reduced since an upper surface of the light-transmittable resin 23 is formed to be concave. If the amount of the light-transmittable resin 23 increases to solve such a problem, the light-transmittable resin 23 may protrude above an upper surface of the package body 15, so that the light-transmittable resin 23 may be damaged by external force.

SUMMARY OF THE INVENTION

An object of the present invention is to provide a side-view type light emitting diode package capable of improving the light emission efficiency.

Another object of the present invention is to provide a side-view type light emitting diode package capable of forming a light-transmittable resin with a convex lens shape by adopting an opening portion formed with a step projection.

According to the present invention for achieving objects, there is provided a side-view type light emitting diode package adopting an opening portion provided with a step projection. The side-view type light emitting diode package comprises a package body having an opening portion for exposing the light emitting diode chip in a light emitting direction. In addition, the side-view type light emitting diode package comprises a light-transmittable resin covering the light emitting diode chip, wherein at least a portion of an inner wall of the opening portion is formed with a step projection for partitioning the opening portion into upper and lower sections, and the lower section of the opening portion below the step projection is filled with the light-transmittable resin.

Here, it is preferred that the light-transmittable resin be formed in a convex lens shape.

In addition, a height of the light-transmittable resin is preferably determined so that the light-transmittable resin is positioned below an upper surface of the package body.

Further, it is preferable that the light-transmittable resin contain a phosphor. Accordingly, the light emitted from the light emitting diode chip can be condensed to improve the light efficiency of the package.

According to another aspect of the present invention, there is a provided a light emitting diode package for emitting light, emitted from a light emitting diode chip, outward, comprising: a package body having an opening portion for exposing the light emitting diode chip in a light emitting direction; and a light-transmittable resin for covering the light emitting diode chip, wherein at least a portion of an inner wall of the opening portion is formed with a step projection for partitioning the opening portion into upper and lower sections, the lower section of the opening portion below the step projection is filled with the light-transmittable resin, and a height of the light-transmittable resin is determined so that the light-transmittable resin is positioned below an upper surface of the package body.

According to the embodiments of the present invention, an opening portion formed with a step projection for partitioning the opening portion into an upper section and a lower section is adopted, and the liquefied resin is dotted, so that light-transmittable resin with a convex lens shape which is defined in the lower section of the opening portion may be easily formed. As such, it is possible to provide a light emitting diode package, especially a side-view type light emitting diode package, capable of improving the light emission efficiency.

DETAILED DESCRIPTION OF THE ILLUSTRATED EMBODIMENTS

Figure 1:
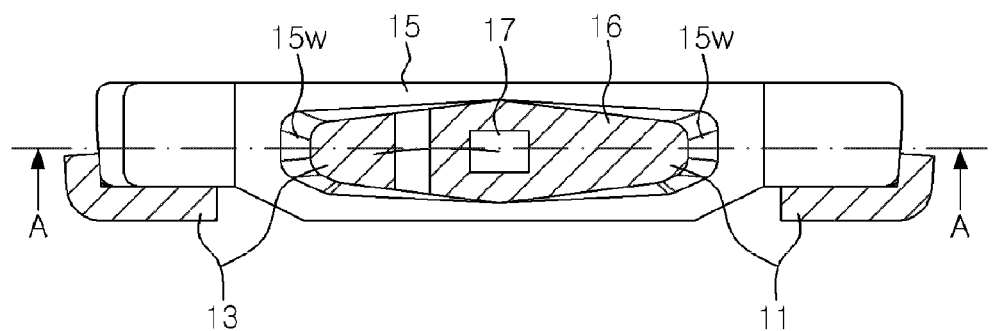
FIG. 1 is a plan view illustrating a conventional side-view type light emitting diode package.
Figure 2:
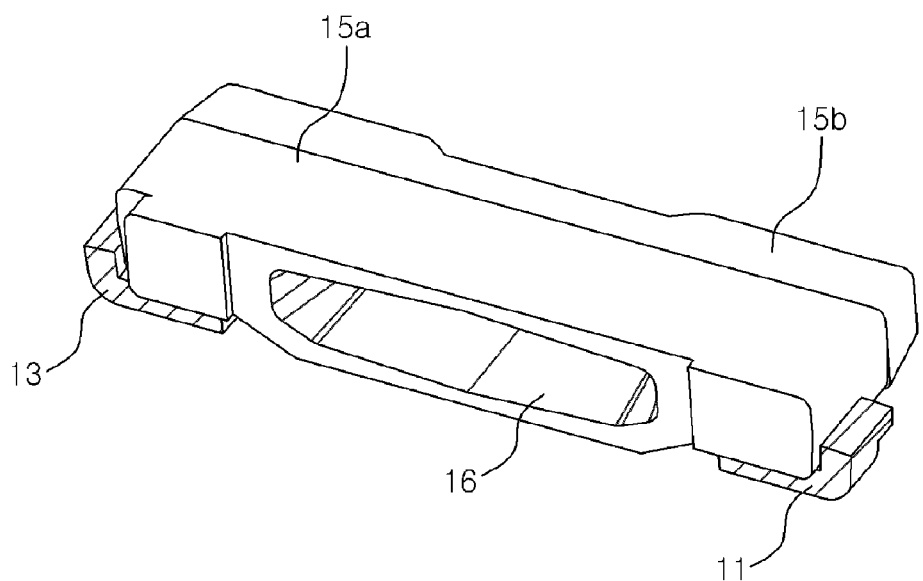
FIG. 2 is a perspective view illustrating the conventional side-view type light emitting diode package.
Figure 3:
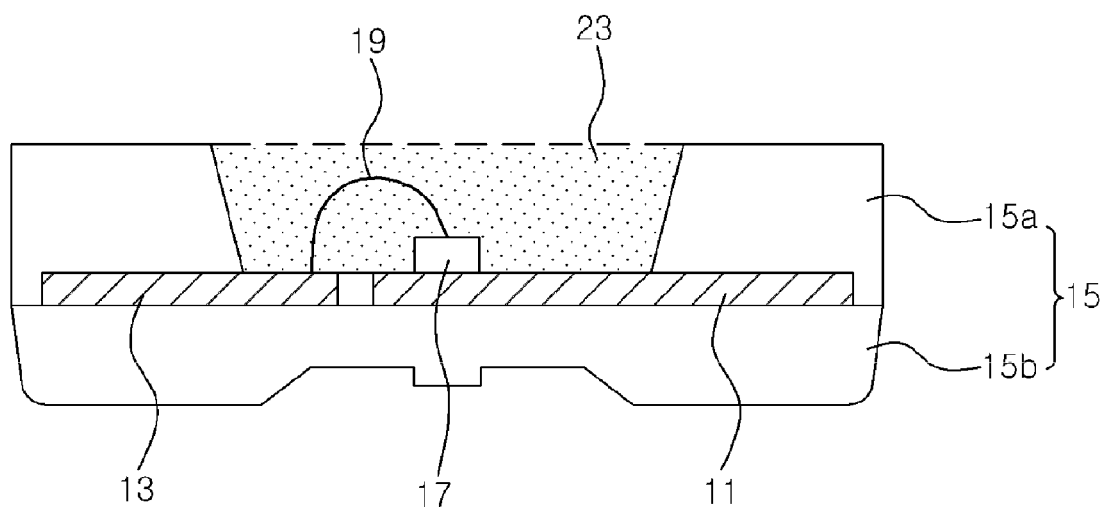
FIG. 3 is a sectional view taken along a dashed dotted line A-A of FIG. 1 to illustrate the conventional side-view type light emitting diode package.
Figure 4:
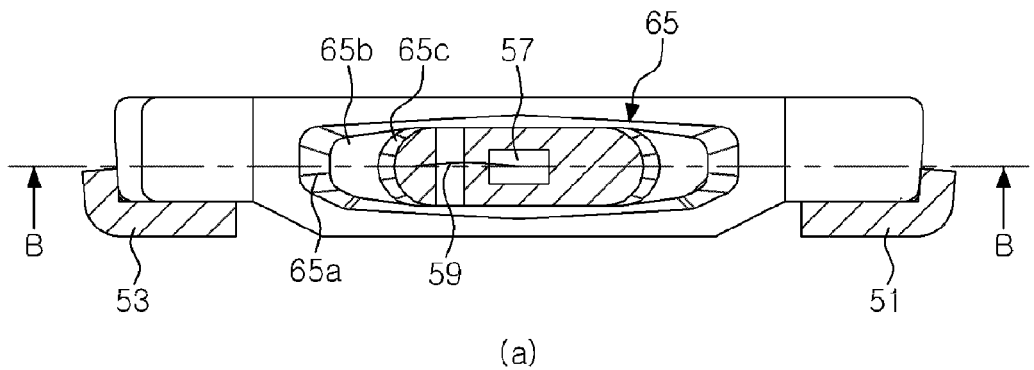
FIGS. 4a and 4b are plan views illustrating a side-view type light emitting diode package according to an embodiment of the present invention.
Figure 4:
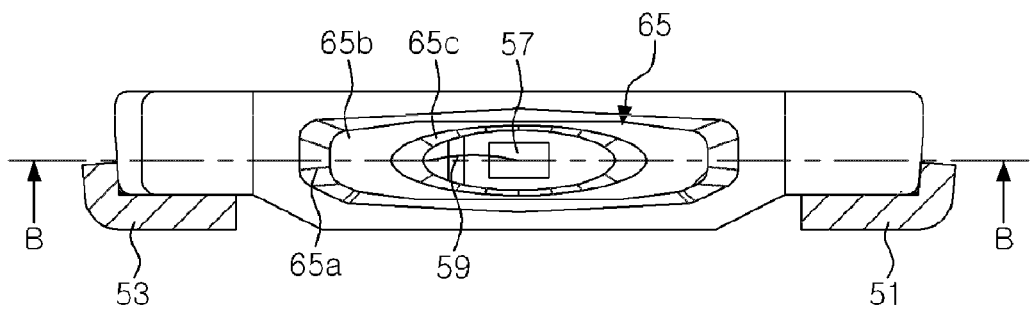
Figure 5:
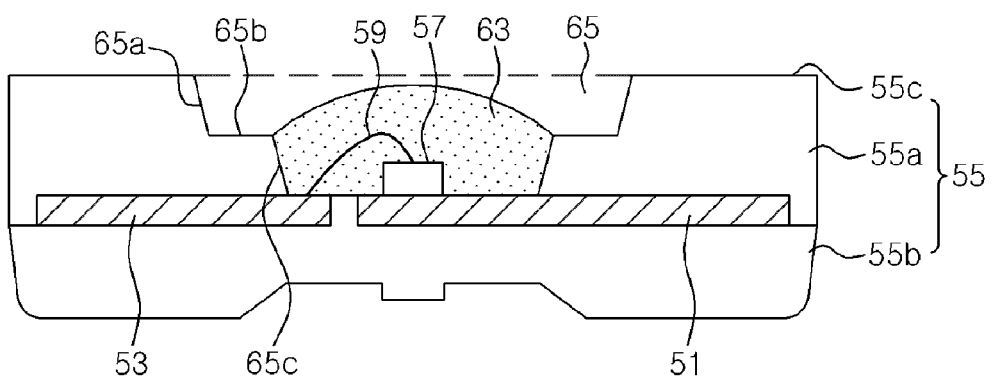
FIG. 5 is a section view taken along a dashed dotted line B-B of FIGS. 4a and 4b to illustrate the side-view type light emitting diode package according to the embodiment of the present invention.

FIGS. 4a and 4b are plan views illustrating a side-view type light emitting diode package according to an embodiment of the present invention, and FIG. 5 is a section view taken along a dashed dotted line B-B of FIGS. 4a and 4b.

Referring to FIGS. 4a, 4b and 5, the side-view type light emitting diode package includes a pair of lead terminals, i.e., first and second lead terminals 51 and 53. The first and second lead terminals 51, 53 define a mounting region for a light emitting diode chip. Meanwhile, the second lead terminal 53 is positioned to be spaced apart from the first lead terminal 51, and positioned with the substantially same level as the first lead terminal 51.

The first and second lead terminals 51 and 53 are formed out of a lead frame manufactured with a phosphor bronze plate, and generally silver-plated in order to improve the reflectivity.

The first and second lead terminals 51 and 53 are supported by a package body 55. The package body 55 may be formed by insert molding the first and second lead terminals 51 and 53. For convenience, the package body 55 is sectionalized into an upper package body 55a and a lower package body 55b based on the position level of the first and second lead terminals 51 and 53.

The package body 55 has an elongated opening portion 65 for exposing portions of the first and second lead terminals 51 and 53 and a light emitting diode chip 57 mounted thereon to the upside. Specifically, the chip 57 is mounted on the first lead terminal 51 and is connected to the second lead terminal 53 by a bonding wire 59. Hereinafter, a lengthwise direction of the elongated opening portion 65 is defined as a major axis direction, while a direction vertical to the lengthwise direction is defined as a minor axis direction.

The first and second lead terminals 51 and 53 are spaced apart from each other in the opening portion 65. Further, the first and second lead terminals 51 and 53 protrude to the outside of the package body 55 in order to be electrically connected to an external power source. The first and second lead terminals 51, 53 which protrude outward may have various shapes, and be bent with various shapes. Herein, there are shown the first and second lead terminals 51 and 53 which are bent from a lower surface of the package body 55 to side surfaces thereof to implement surface mounting.

Referring to FIGS. 4a and 5, an inner wall of the opening portion 65 is provided with a step projection 65b across the major axis direction. Accordingly, the step projection 65b partitions the opening portion 65 into an upper section defined by an upper inner wall 65a above the step projection 65b and a lower section defined by a lower inner wall 65c below the step projection 65b.

Referring back to FIG. 5, a light-transmittable resin 63 containing a phosphor may be formed on the light emitting diode chip 57. The light-transmittable resin 63 may be formed by dotting a liquefied resin containing a phosphor in the lower section of the opening portion 65, which is defined by the lower inner wall 65c of the opening portion 65 below the step projection 65b. Therefore, the light-transmittable resin 63 may be limitedly formed in the lower section of the opening portion 65 to have a convex lens shape. Since a conventional side-view type light emitting diode package has a flat bottom surface, it is difficult to form the light-transmittable resin by dotting a liquefied resin. However, according to the embodiments of the present invention, since the step projection 65b formed in the opening portion 65 partitions the opening portion 65 into the upper and lower sections, the light-transmittable resin 63 defined in the lower section of the opening portion 65 can be easily formed using the liquefied resin.

The light-transmittable resin 63 may be formed of, for example, epoxy or silicone resin, and contain a phosphor for converting light emitted from the light emitting diode chip 57, e.g., blue light, to yellow light, so that a side-view type light emitting diode package emitting white light can be provided. The light emitting diode chip 57 and the phosphor may be variably selected, so that the light having variable colors can be implemented.

Meanwhile, the height of the light-transmittable resin 63 is preferably determined so that the light-transmittable resin 63 formed in the lower section of the opening portion 65 is positioned below an upper surface 55c of the package body 55.

Meanwhile, referring to FIGS. 4b and 5, the step projection 65b with an elongated shape may be formed over the whole inner wall of the opening portion 65. In this case, the width of the step projection 65b may be narrower in the major axis of the opening portion 65 while it may be wider in the minor axis thereof. Such a step projection 65b partitions the opening portion 65 into the upper section defined by the upper inner wall 65a above the step projection 65b and the lower section defined by the lower inner wall 65c below the step projection 65b, so that the light-transmittable resin 63 with a convex lens shape which is defined in the lower section of the opening portion 65 can be easily formed as described above.

Therefore, since it is possible to provide the side-view type light emitting diode package having the light-transmittable resin with a convex lens shape which may not be damaged or polluted by external force, a condensing effect can be induced due to the light-transmittable resin 63 with a convex lens shape to thereby improve the light emission efficiency as compared with a side-view type light emitting diode package having a light-transmittable resin with a concave or flat shape.

The invention claimed is:
1. A side-view type light emitting diode package comprising:
a package body comprising an opening and a step projection that extends into the opening, so as to divide the opening into a top portion and a bottom portion;

a first lead terminal and a second lead terminal that extend into the package body, such that end portions of the first and the second lead terminals are disposed below the step projection and exposed through the opening;
a light emitting diode chip disposed on the exposed end portion of the first lead terminal; and
a light-transmittable resin disposed in the bottom portion of the opening, so as cover the light emitting diode chip,
wherein the light-transmittable resin is in contact with an inner wall of the bottom portion, and the top portion and the step projection comprise a resin-free area,
wherein a width of the step projection extending into the opening varies about at least a portion of the opening, and
wherein the step projection only extends along two sides of the light emitting diode chip.

2. The side-view type light emitting diode package as claimed in claim 1, wherein the light-transmittable resin forms a convex lens.

3. The side-view type light emitting diode package as claimed in claim 2, wherein the uppermost surface of the light-transmittable resin is positioned below the uppermost surface of the package body.

4. The side-view type light emitting diode package as claimed in claim 1, wherein the light-transmittable resin comprises a phosphor.

5. The side-view type light emitting diode package as claimed in claim 1, wherein the top portion comprises an opening having a greater width than that of the bottom portion.

6. The side-view type light emitting diode package as claimed in claim 1, wherein the step projection has a curved edge.

7. The side-view type light emitting diode package as claimed in claim 6, wherein the light-transmittable resin forms a convex lens.

8. The side-view type light emitting diode package as claimed in claim 7, wherein the uppermost surface of the light-transmittable resin is disposed below the uppermost surface of the package body.

9. The side-view type light emitting diode package as claimed in claim 6, wherein the light transmittable resin comprises a phosphor.

10. The side-view type light emitting diode package as claimed in claim 1, wherein a width of the top portion varies with respect to a depth of the top portion, and a width of the bottom portion varies with respect to a depth of the bottom portion.

11. The side-view type light emitting diode package as claimed in claim 1, wherein the step projection is substantially planar along the width.

* * * * *